United States Patent [19]

Swartz

[11] 4,385,971

[45] May 31, 1983

[54] ELECTROLYTIC ETCH FOR ELIMINATING SHORTS AND SHUNTS IN LARGE AREA AMORPHOUS SILICON SOLAR CELLS

[75] Inventor: George A. Swartz, North Brunswick, N.J.

[73] Assignee: RCA Corporation, New York, N.Y.

[21] Appl. No.: 277,983

[22] Filed: Jun. 26, 1981

[51] Int. Cl.³ .......................... H01L 31/18; C25F 3/12
[52] U.S. Cl. ................................ 204/129.1; 136/258; 136/290; 204/129.3
[58] Field of Search .......................... 204/129.1, 129.3; 136/290, 258 AM, 243

[56] References Cited

U.S. PATENT DOCUMENTS

| | | | |
|---|---|---|---|
| 4,166,918 | 9/1979 | Nostrand et al. | 136/243 |
| 4,180,439 | 12/1979 | Deines et al. | 204/1 T |
| 4,197,141 | 4/1980 | Bozler et al. | 136/258 |

Primary Examiner—Aaron Weisstuch
Attorney, Agent, or Firm—Birgit E. Morris; Donald S. Cohen

[57] ABSTRACT

The present invention relates to a method for removing electrical shorts and shunts from solar cells, such as amorphous silicon solar cells. The method involves back-biasing the solar cells while they are in an electrolytic solution. It has been found that the process results in the removal of the shorts and shunts present in the cell.

4 Claims, 1 Drawing Figure

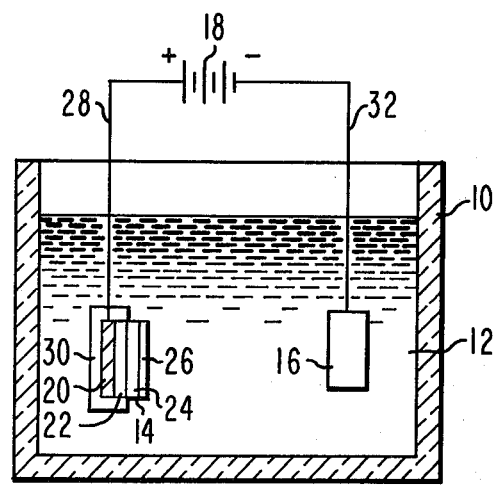

ELECTROLYTIC ETCH FOR ELIMINATING SHORTS AND SHUNTS IN LARGE AREA AMORPHOUS SILICON SOLAR CELLS

BACKGROUND OF THE INVENTION

The present invention relates to a method of improving the performance of solar cells. In particular, the invention relates to a method of removing electrical shorts and shunts created during the process of fabricating such solar cells.

The voltage and current output of thin film solar cells, such as amorphous silicon solar cells of the type described in U.S. Pat. No. 4,064,521 entitled SEMICONDUCTOR DEVICE HAVING A BODY OF AMORPHOUS SILICON which issued on Dec. 20, 1977 to D. E. Carlson, may be greatly reduced or completely eliminated by the presence of electrical shorts or shunts formed during the process of fabricating such solar cells. Electrical shorts occur either when there is a hole, such as a pinhole, in the semiconductor body which causes the front and back electrodes to touch or if there is a conductive metal which extends through the semiconductor body.

A shunt is the loss of charge in the semiconductor body due either to an imperfect barrier formation or to the formation of an ohmic contact by a high work function metal rather than a Schottky barrier. The problems created by solar cell defects which cause shorts or shunts are greatly increased with increased solar cell size.

In order to economically fabricate large area solar cells, either methods to eliminate such shorts and shunts during fabrication or methods of removing such defects after fabrication must be developed. In U.S. Pat. No. 4,166,918 entitled METHOD OF REMOVING THE EFFECTS OF ELECTRICAL SHORTS AND SHUNTS CREATED DURING THE FABRICATION PROCESS OF A SOLAR CELL which issued on Sept. 4, 1979 to G. E. Nostrand et al., a method for removing the effects of electrical shorts and shunts in large area solar cells is described. In accordance with that method, there is used a reverse bias voltage of sufficient magnitude to burn out the defects in the solar cell, but of a magnitude less than the breakdown voltage of the cell.

It has now been found that the method described in the U.S. patent issued to Nostrand et al., while successful in many cases, can be improved upon.

SUMMARY OF THE INVENTION

In accordance with the present invention, a solar cell with a short or shunt is placed into an electrolytic solution and the cell is reverse biased. It has been found that current will only flow through the short or shunt, and not through the remaining portions of the cell. As a result, the short or shunt is eliminated through a process which the inventor believes involves either electrochemical etching of the cell or mechanical removal via a bubble blasting process. While the precise mechanism is not understood, the present invention has been shown to eliminate shorts and shunts on cells where the method of the prior art was not successful.

BRIEF DESCRIPTION OF THE DRAWING

The FIGURE of the drawing is a cross-sectional view showing the present invention in use.

DETAILED DESCRIPTION OF AN EXEMPLARY EMBODIMENT

In accordance with the present invention, one starts with a container 10 which holds an electrolyte 12, as shown in the drawing. A solar cell 14 having shorts and/or shunts is placed into the electrolyte 12 along with a counter electrode 16. The electrode 16 is connected to one terminal of a voltage supply 18, and the other terminal of the voltage supply 18 is connected to one terminal of the solar cell 14. As will be seen, the manner of connecting the solar cell 14 and the electrode 16 to the voltage supply 18 is determined such that the rectifying junction of the solar cell 14 is reverse biased. As a result, current will only flow through the shorts and/or shunts which are present in the solar cell 14, and such current will only flow for a time sufficient to remove the shorts and/or shunts through a process which involves some type of etching. While the precise mechanism for the process is not well known or understood, the result is that a hole is formed around the short and/or shunt which is thereby electrically removed from the solar cell 14.

By way of example, amorphous silicon solar cells were placed into an electrolyte of dilute sulfuric acid ($H_2SO_4$) for three minutes with each solar cell 14 reverse biased at two volts. Shorts and/or shunts that had previously been present in the cells and which were not removed by the method of the prior art, namely the method described in U.S. Pat. No. 4,166,918, were removed by the present process.

In general, the inventive process requires that a solution be used as an electrolyte which will only etch when the proper polarity of current is applied. At that time, the etch rate will be highest where the current is highest, i.e. where there is a short or a shunt. The polarity of current, determined by the polarity of the voltage supply 18, must be appropriate to the particular cell structure of the solar cell 14. Thus, the process requires that the solar cell 14, which will typically have a diode-like structure with an intrinsic region between a P type region and an N type region, should be connected to the power supply 18 such that the solar cell is reverse biased. Current will therefore have a tendency not to flow, except where a short or shunt is found. In the area of a short or a shunt, current flow will not be prevented by the presence of a reverse biased semiconductor barrier. Thus, in such high current density areas, an electrolytic etch will be conducted. Such an etch will continue as long as the high current area exists, i.e. until the short and/or shunt is removed.

With particular reference, therefore to FIG. 1, a particular embodiment of a solar cell 14 is shown to comprise a stainless steel substrate 20 having an N type layer 22, typically of amorphous silicon, formed thereon. An intrinsic region 24 adjoins the N type region 22, and a platinum Schottky barrier 26 contacts the intrinsic region 24. As will be recognized by those skilled in the art, the particular structure of the amorphous silicon solar cell 14 is by no means the only type of structure used for such cells, but is merely illustrated as one representative type.

The stainless steel substrate 20 is attached to the positive terminal of the voltage supply 18 via an insulated, conductive wire 28. The wire 28 must be insulated in order to prevent current flow to portions of the wire which are immersed in the electrolyte 12. For similar reasons, an insulating layer 30, such as a paint, is applied over the exposed portions of the stainless steel substrate 20. An electrode 16, which in the preferred embodiment of the invention is typically either gold or platinum, is connected to the negative terminal of the power supply 18 via a conductive wire 32 which will also typically be insulated in order to prevent it from being affected by the electrolyte 12.

Current can only flow to the electrode 16 through the electrolyte 12 from those portions of the solar cell 14 which include shorts and/or shunts. A typical electrolyte for use in a cell structure in which the N type terminal is connected to the positive terminal of the voltage supply is either dilute sulfuric acid ($H_2SO_4$) or dilute copper sulfate ($CuSO_4$).

Alternatively, where the cell structure includes a P type region adjacent a conductive substrate, i.e. a stainless steel/P-I-N/ITO structure, then the stainless steel substrate would be connected to the negative terminal of the voltage supply 18 and an electrolyte such as a 20% solution of ammonium hydroxide ($NH_4OH$), would be used.

I claim:

1. A method for improving the performance of an amorphous silicon solar cell which incorporates a highly conductive electrode contacting one of the layers of the solar cell, comprising the step of applying a reverse bias voltage to said highly conductive layer while said solar cell is immersed in an electrolyte, said reverse bias voltage being applied through said electrolyte, whereby shorts or shunts in said solar cell are removed by an electrolytic etch of said solar cell.

2. The method according to claim 1 further comprising insulating the highly conductive electrode of the solar cell from said electrolyte.

3. The method according to claim 2 wherein the highly conductive electrode of said photocell is adjacent to and contacts a P type semiconductor region and said electrolyte comprises a weak solution of ammonium hydroxide ($NH_4OH$).

4. The method of claim 2 wherein an N type semiconductor region is adjacent to said highly conductive electrode of said photocell and said electrolyte is selected from the group consisting of dilute sulfuric acid ($H_2SO_4$) and dilute copper sulfate ($CuSO_4$).

* * * * *